(12) United States Patent
Geiger et al.

(10) Patent No.: US 6,807,041 B2
(45) Date of Patent: Oct. 19, 2004

(54) ELECTRONIC TRIGGERING FOR HEATING ELEMENTS

(75) Inventors: Steffen Geiger, Asperg (DE); Thomas Giffels, Stuttgart (DE); Klaus Neckel, Sachsenheim (DE)

(73) Assignee: Beru AG, Ludwigsburg (DE)

( * ) Notice: Subject to any disclaimer, the term of this patent is extended or adjusted under 35 U.S.C. 154(b) by 14 days.

(21) Appl. No.: 09/935,161

(22) Filed: Aug. 23, 2001

(65) Prior Publication Data

US 2002/0023916 A1 Feb. 28, 2002

(30) Foreign Application Priority Data

Aug. 23, 2000 (DE) .......................................... 100 41 417

(51) Int. Cl.[7] .................................................. H02H 7/00
(52) U.S. Cl. ..................................... 361/103; 361/124
(58) Field of Search ................................ 361/103, 124, 361/100, 106, 91; 429/61, 62, 65

(56) References Cited

U.S. PATENT DOCUMENTS

| | | | |
|---|---|---|---|
| 3,347,975 A | 10/1967 | Shannon | ..................... 174/708 |
| 5,508,885 A | 4/1996 | Ishimoto | ...................... 361/720 |
| 5,871,858 A | * 2/1999 | Thomsen et al. | ............... 429/7 |
| 6,320,159 B1 | 11/2001 | Topp | ........................... 219/203 |

FOREIGN PATENT DOCUMENTS

| | | |
|---|---|---|
| DE | 38 29 117 A1 | 3/1990 |
| DE | 197 51 423 A1 | 6/1999 |
| GB | 2 258 563 A | 2/1993 |

OTHER PUBLICATIONS

Patent Abstracts of Japan vol. 009, No. 310, Dec. 6, 1985 & JP 60 145647 A (Fujitsu KK) Aug. 1, 1985 Abstract.

European Search Report Dated Dec. 30, 2003.

* cited by examiner

*Primary Examiner*—Lawrence Luk
(74) *Attorney, Agent, or Firm*—Nixon Peabody LLP; David S. Safran

(57) ABSTRACT

A heating element and a process for conducting the operating heat of a semiconductor switch to a heating cell which is triggered by the semiconductor switch via first and second heat and current conducting material strips and a frame terminal with an interposed heat-conducting insulating film. The semiconductor switch is provided with a cooling fin and is applied directly to a surface of the first heat and current conducting material strip.

8 Claims, 1 Drawing Sheet

ELECTRONIC TRIGGERING FOR HEATING ELEMENTS

BACKGROUND OF THE INVENTION

1. Field of the Invention

The present invention relates to a process for conducting the operating heat of a conventional semiconductor switch to a heating element which is triggered by the semiconductor switch, and relates to such a heating element.

2. Description of the Related Art

To switch high currents, ordinarily, semiconductor switches are used which consist essentially of a switch housing and a semiconductor chip which is located therein. The internal resistance of this semiconductor switch results in power loss in the form of heat. When the heating elements are triggered, ordinarily, the attempt is made to route this heat into the medium which is to be heated by the heating element. This takes place by special heat sinks which are placed in the medium to be heated in addition to the actual heating element.

The disadvantage in these approaches is the circumstance that additional components, such as the aforementioned heat sinks, are used to cool the semiconductor switches. These heat sinks must be placed, in addition to the heating element, in the medium to be heated. This causes the heat sinks to act as a secondary heating element relative to the actual heating element with the resulting non-uniform temperature and pressure distribution. Also, the additional components require more construction space, and at the same time, additional costs for material and installation arising.

SUMMARY OF THE INVENTION

A primary object of the invention is to cause heat transport from a semiconductor switch to the actual heating cell, to reduce the number of required mechanical components, and to simplify the structure and installation of one such arrangement.

This object, as well as other objects, is achieved in accordance with the present invention by providing a semiconductor switch having a cooling fin applied directly on a surface of a first heat-conducting and current conducting material strip which is connected to a supply voltage, the first material strip resting on a second heat-conducting and current conducting material strip. Disposed between the first and second material strips is a heat-conducting insulating film, whereby the second material strip rests directly on a surface of a frame terminal to a heating cell of a heating element which, in turn, rests on a surface of a strip-shaped power supply terminal, with a second heat-conducting insulating film disposed therebetween.

DETAILED DESCRIPTION OF THE INVENTION

Figure 1:
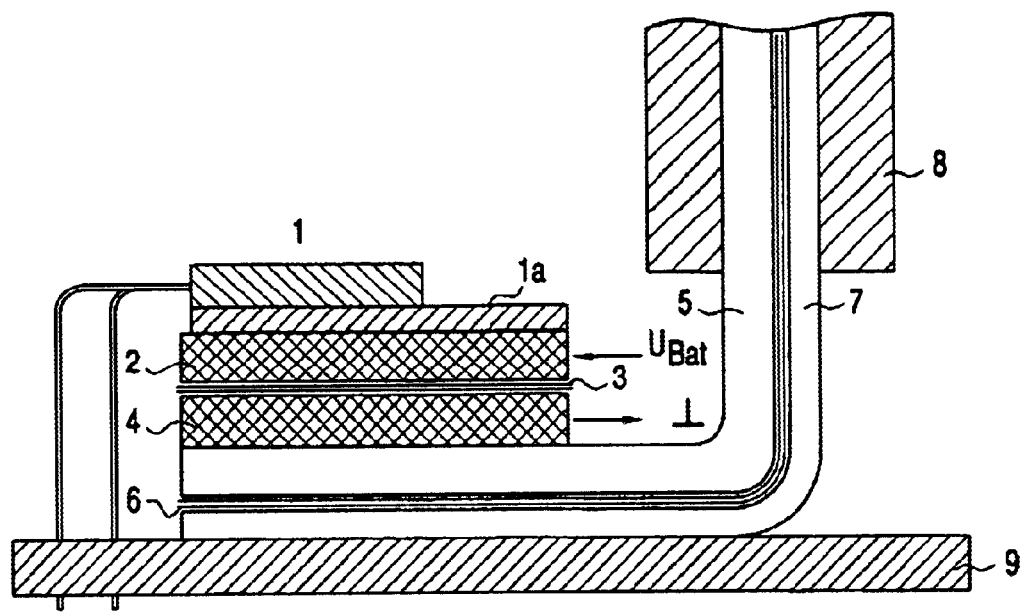
FIG. 1 schematically shows a side view of the heating element in accordance with the present invention.
Figure 2:
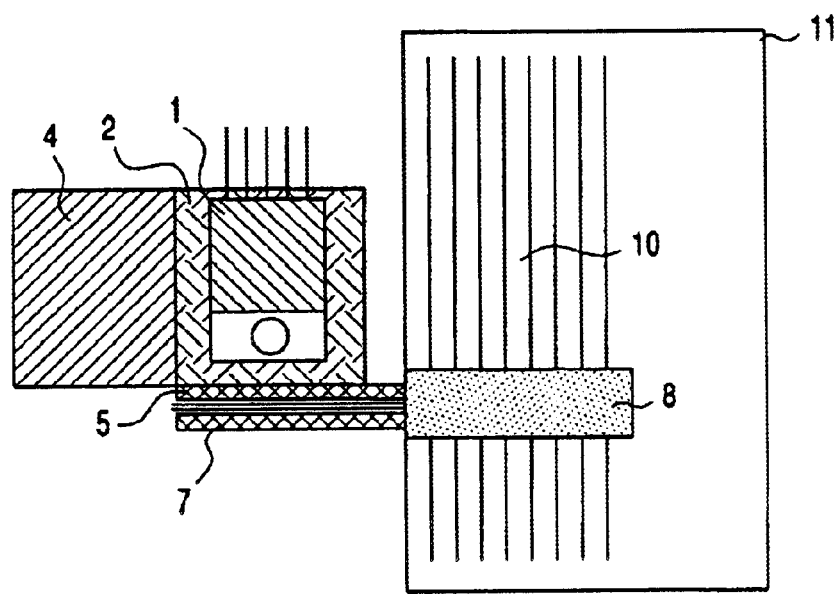
FIG. 2 shows a plan view of the embodiment of the heating element in accordance with the present invention as shown in FIG. 1.

Using FIGS. 1 & 2, the process in accordance with the present invention and the heating element in accordance with the present invention are fundamentally described. In FIGS. 1 & 2, a semiconductor switch 1 having a cooling fin 1a in commercial form is shown, with a housing that is in direct contact with a surface of a heat and current conducting material strip 2 which is connected to a power supply voltage. Preferably, the heat and current conducting material strip 2 is made as a bent stamping to which the semiconductor switch 1 and cooling fin 1a are soldered.

The heat and current conducting material strip 2 is connected to the power supply voltage ($U_{Bat}$) via a screw, clamp, plug, compression, weld or solder connection. The semiconductor switch 1 is supplied with the power supply voltage via the heat and current conducting material strip 2. At the same time, the heat and current conducting material strip 2 transports the heat which forms in the semiconductor switch 1 further via a heat conducting insulating film 3 to a second heat conducting and current conducting material strip 4. Preferably, the heat and current conducting material strip 4 is also made as a bent stamping. The heat-conducting insulating film 3 ensures that an electrical short circuit cannot occur between the heat and current conducting material strips 2, 4. Preferably, the thermal conductivity of the insulating film 3 is very high so that the power loss of the semiconductor switch 1 can be relayed from the heat and current conducting material strip 2 to the heat and current conducting material strip 4 with the smallest possible loss. A suitable material for the insulating film 3 is a ceramic heat-conductive film such as kerafol WLF 86/74, with a thermal conductivity $\lambda=1.8$ W/mK and a thickness of roughly 0.2 mm.

The heat and current conducting material strip 4 is connected to the frame via a screw, clamp, plug, compression, weld or solder connection. The heat and current conducting material strip 4 rests directly on the surface of a frame terminal 5. The frame terminal 5 is made preferably as a bent stamping. The frame terminal 5 is electrically and thermally connected to the actual heating cell 8 of the heating element 11 via a screw, clamp, plug, compression, weld or solder connection. The heating cell 8 preferably comprises a plurality of PTC heating elements.

The frame terminal 5 is electrically and thermally connected in this way to the heating cell 8 so that the frame potential and at the same time the heat formed in the semiconductor switch 1 are routed to the heating cell 8. The PTC elements, which are located in the heating cell 8, are supplied via the heating cell 8 (heat tube) with the frame potential.

Provided on the heating cell 8 are cooling louvers 10 by which the heat from the semiconductor switch 1 and the heat from the PTC elements is dissipated to the medium to be heated. The semiconductor switch 1, combined with the heat and current conducting material strips 2, 4, a heat bridge and insulating layers 3, 6, the heating cell 8 and cooling louvers 10, jointly form the heating element 11. Likewise, a strip-shaped power supply terminal 7 via which the PTC elements make contact with $U_{Bat}$ leads into the heating cell 8. The power supply terminal 7 is insulated relative to the frame terminal 5 by the heat conducting insulating film 6. A capton film can be used as the insulting film 6 with a suitable thickness of roughly 0.05 mm and a thermal conductivity of roughly $\lambda=0.76$ W/mK. Preferably, the strip-shaped power supply terminal 7, the bent stampings 2, 4, 5 and the insulating films 3, 6 are pressed as a package on the circuit board 9.

Preferably, the power supply terminal 7 is connected to $U_{Bat}$ via the circuit board 9 and the terminal wires of the semiconductor switch 1. Preferably, the heat-conducting and current conducting material strips 2, 4 and the frame terminal 5 each comprise electrocopper because such a material ensures good electrical and thermal conductivity. Preferably, a suitable material such as electrocopper having a thermal conductivity $\lambda=400$ W/mK and a thickness of 1.0 mm and more is used. The power supply terminal 7 which is roughly 0.6 mm thick comprises nickel-plates brass so that the PTC components in the heat tube can make good, permanent contact.

The process in accordance with the present invention is simple and effective; the heating element which is made in this way requires fewer components, is simple and economical to produce, and can be made space-saving.

What is claimed is:

1. A process for conducting operating heat of a semiconductor switch to a heating cell which is triggered by the semiconductor switch, comprising the steps of:

providing a cooling fin on the semiconductor switch;

placing said semiconductor switch over a surface of a first heat and current conducting material strip, said first heat and current conducting material strip being electrically connected to a supply voltage;

placing said first heat and current conducting material strip over a surface of a second heat and current conducting material strip with a heat-conducting insulating film located between the first and second heat and current conducting material strips;

placing said second heat and current conducting material strip on a surface of a frame terminal;

providing a heating cell;

electrically and thermally connecting said frame terminal to said heating cell;

placing said frame terminal on a surface of a second heat-conducting insulating film;

providing a supply terminal; and then placing said heat-conducting insulating film on a surface of said power supply terminal.

2. A heating element comprising:

a semiconductor switch for triggering a heating element, said semiconductor switch including a cooling fin, a first heat and current conducting material strip, said first heat and current conducting material strip being electrically connected to a supply voltage and being in contact with a surface of said semiconductor switch;

a second heat and current conducting material strip, said first heat and current conducting material strip being positioned over a surface of said second heat and current conducting material strip;

a first heat conducting thermally insulating film, said first heat conducting thermally insulating film being disposed between said first and second heat and current conducting material strips;

a heating cell;

a frame terminal, said frame terminal being electrically and thermally connected to said heating cell, said heat and current conducting material strip being positioned over a surface of said frame terminal;

a power supply terminal; and a second heat conducting thermally insulating film, said second heat conducting thermally insulating film being disposed between said frame terminal and said power supply terminal.

3. The heating element as claimed in claim 2, wherein said first heat and current conducting material strip and said second heat and current conducting material strip each comprise electrocopper.

4. The heating element as claimed in claim 3, wherein said electrocopper has a thermal conductivity $\lambda=400$ W/mK and a thickness of 1.0 mm.

5. The heating element as claimed in claim 4, wherein said frame terminal comprises electrocopper.

6. The heating element as claimed in claim 5, wherein said electrocopper has a thermal conductivity $\lambda=400$ W/mK and a thickness of 1.0 mm.

7. The heating element as claimed in claim 5, wherein said power supply terminal comprises nickel-plated brass.

8. The heating element as claimed in claim 3, wherein said power supply terminal comprises nickel-plated brass.

* * * * *